(12) United States Patent
Imai (10) Patent No.: US 6,368,754 B1
(45) Date of Patent: Apr. 9, 2002

(54) RETICLE USED FOR FABRICATION OF SEMICONDUCTOR DEVICE

(75) Inventor: Kiyotaka Imai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/442,251

(22) Filed: Nov. 15, 1999

(30) Foreign Application Priority Data

Nov. 13, 1998 (JP) .......................... 10-323657

(51) Int. Cl.[7] .............. G03F 9/00; G03C 5/00
(52) U.S. Cl. ......................... 430/5; 430/394
(58) Field of Search ................ 430/5, 311, 312, 430/394; 438/751; 355/53; 250/492.22

(56) References Cited

U.S. PATENT DOCUMENTS

| | | | | |
|---|---|---|---|---|
| 5,853,923 A | * | 12/1998 | Tzu | 430/5 |
| 5,995,200 A | * | 11/1999 | Pierrat | 430/5 |
| 6,146,908 A | * | 11/2000 | Falque et al. | 438/11 |
| 6,150,059 A | * | 11/2000 | Tanabe et al. | 430/5 |

FOREIGN PATENT DOCUMENTS

| | | |
|---|---|---|
| JP | 60-221757 | 11/1985 |
| JP | 61-283125 | 12/1986 |
| JP | 3-270134 | 12/1991 |
| JP | 4-273245 | 9/1992 |
| JP | 4-337732 | 11/1992 |
| JP | 5-197126 | 8/1993 |
| JP | 5-87179 | 12/1993 |

* cited by examiner

*Primary Examiner*—S. Rosasco
(74) *Attorney, Agent, or Firm*—Hutchins, Wheeler & Dittmar (57) ABSTRACT

There is provided a reticle used for fabrication of a semiconductor device, including (a) a first area in which a first mask having a first pattern is formed for forming a first contact hole having a first size, and (b) a second area in which a second mask having a second pattern is formed for forming a second contact hole having a second size different from the first size. The reticle makes it possible to transfer a contact pattern to a resist film in exposure conditions suitable for a size of a contact hole. Thus, a contact hole is transferred to a resist film in a designed dimension regardless of a size thereof.

12 Claims, 11 Drawing Sheets

RETICLE USED FOR FABRICATION OF SEMICONDUCTOR DEVICE

BACKGROUND OF THE INVENTION

1. Field of the Invention

The invention relates to a reticle and a method of fabricating a semiconductor device through the use of the reticle.

2. Description of the Related Art

Patterns having various sizes are selected in designing layout of LSI. Hence, a mask may have both a pattern for forming a contact hole defined in a minimum design rule, such as a 0.2 μm×0.2 μm square hole, and a pattern for forming a contact hole having a greater size, such as a 0.4 μm×0.4 μm square hole.

When patterns for forming contact holes having various sizes are transferred to a resist, a suitable amount of light to be radiated to a resist varies in dependence on a size of a pattern. If a first pattern for forming a first contact hole and a second pattern for forming a second contact hole having a greater size than a size of the first contact hole are both exposed to light in such exposure condition that the first contact hole has a designed dimension, the second contact hole would be formed in a greater size than designed. For instance, if a first pattern for forming a 0.2 μm×0.2 μm contact hole and a second pattern for forming a 0.4 μm×0.4 μm contact hole are both exposed to light in such exposure condition that the 0.2 μm×0.2 μm contact hole is properly formed, the 0.4 μm×0.4 μm contact hole would be formed in a size in the range of 0.5 μm×0.5 μm to 0.6 μm×0.6 μm.

As a result, a margin between gate electrodes and a margin between field oxide films are eliminated in a contact hole such as the above-mentioned 0.4 μm×0.4 μm contact hole. This causes a problem that a contact leak current is increased.

Hence, in a conventional method of fabricating a semiconductor device, there have been prepared two reticles in one of which a first mask is formed for patterning a contact hole having a first size, and in the other of which a second mask is formed for patterning a contact hole having a second size.

A conventional method of fabricating a semiconductor device through the use of a reticle is explained hereinbelow with reference to FIGS. 1A to 5B.

Figure 1:
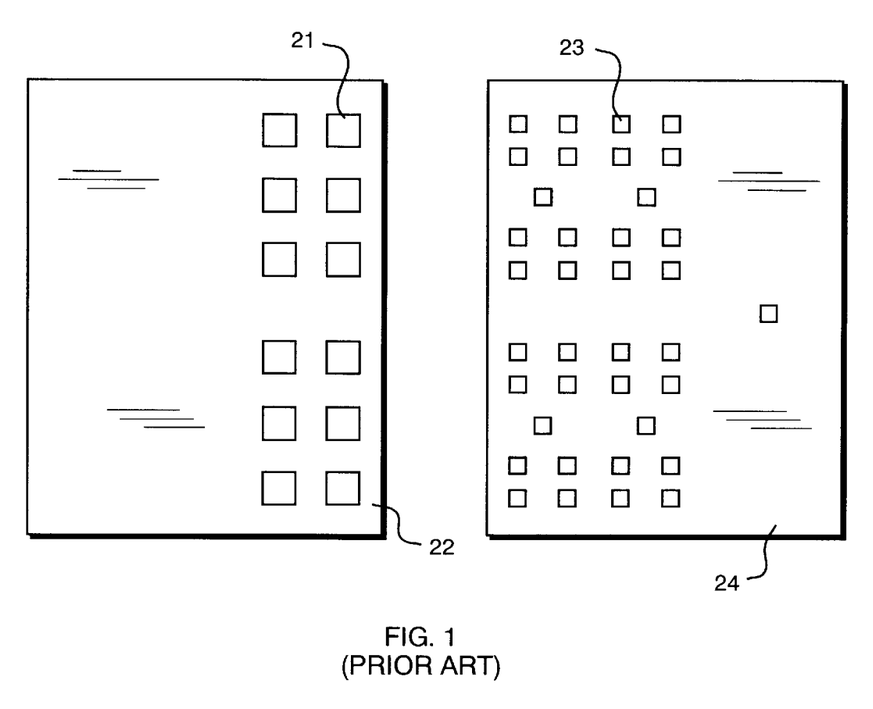
FIG. 1 is a plan view of a conventional reticle.

First, as illustrated in FIG. 1, there are prepared a first reticle 22 having a first pattern 21 for forming first contact holes, and a second reticle 24 having a second pattern 23 for forming second contact holes having a smaller size than a size of the first contact holes.

Figure 2A:
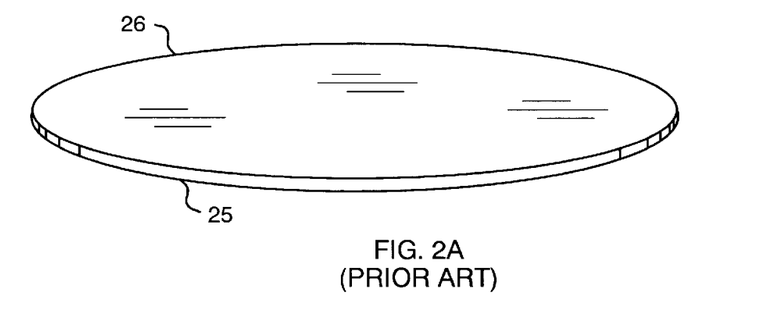
FIGS. 2A, 2B, 3A, 3B, 4A, 4B, 5A and 5B are perspective views of a wafer and a reticle, illustrating respective steps of a method of patterning a wafer through the use of a conventional reticle.

Then, as illustrated in FIG. 2A, positive resist 26 is coated all over a wafer 25.

Figure 2B:
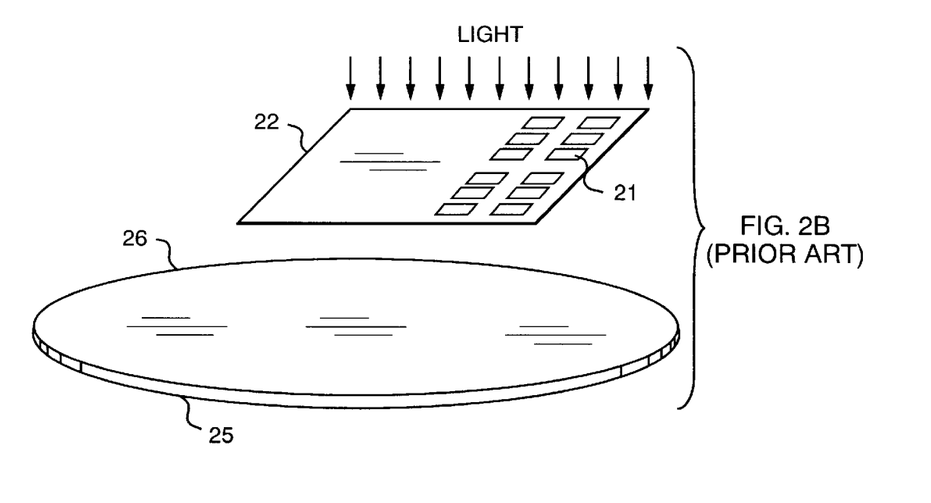
Figure 3A:
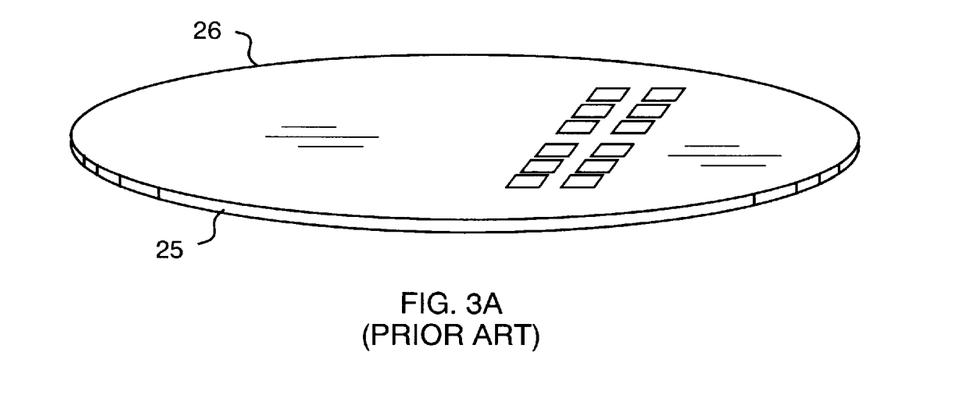

Then, as illustrated in FIG. 2B, the first reticle 22 is aligned onto a pattern formed in the previous step. Then, the positive resist 26 is exposed to light, and thereafter, developed, as illustrated in FIG. 3A. Thus, the first pattern 21 for forming the first contact holes is transferred onto the positive resist 26.

Figure 3B:
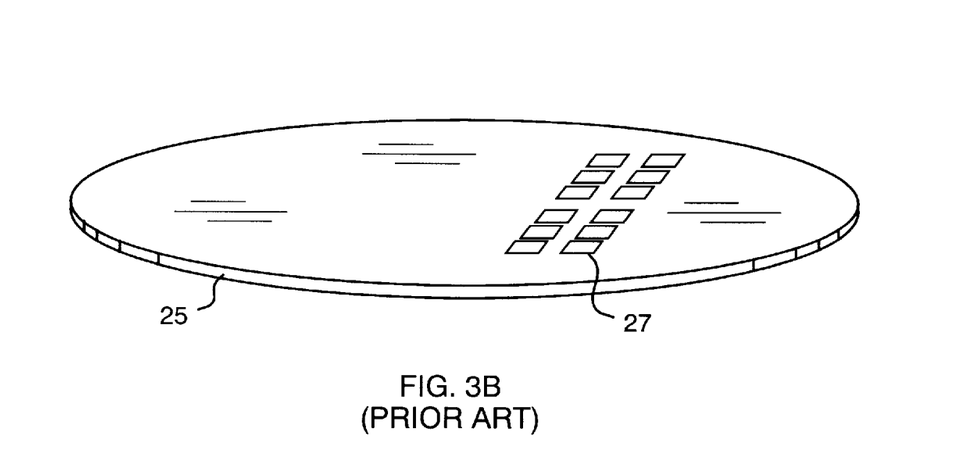

Then, the wafer 25 is etched with the thus patterned positive resist 26 being used as a mask. Then, the positive resist 26 is removed. Thus, the first contact holes 27 are formed in the wafer 25, as illustrated in FIG. 3B.

Figure 4A:
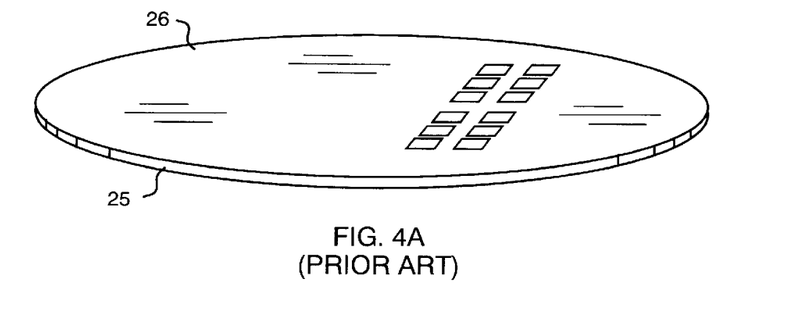

Then, as illustrated in FIG. 4A, the positive resist is coated all over the wafer 25 again.

Figure 4B:
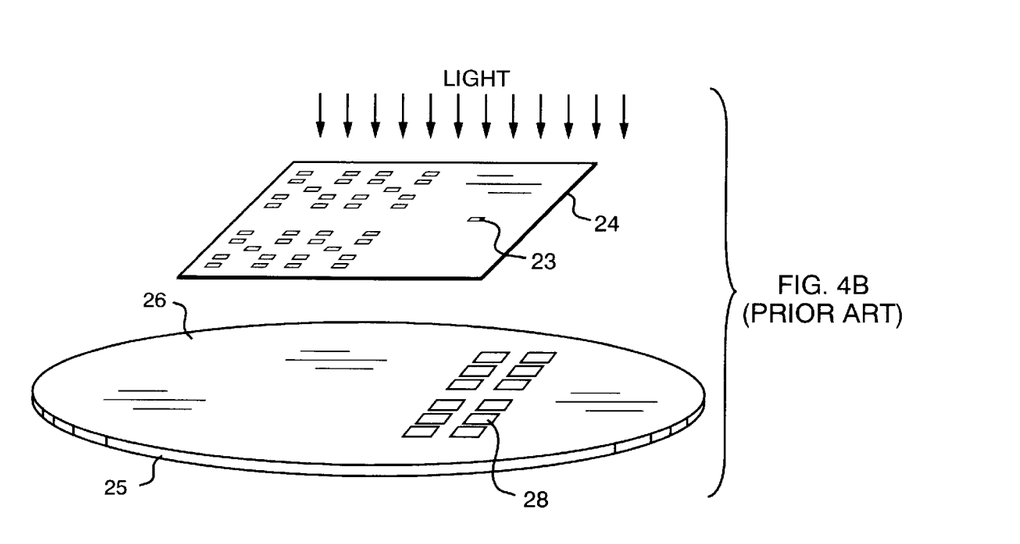
Figure 5A:
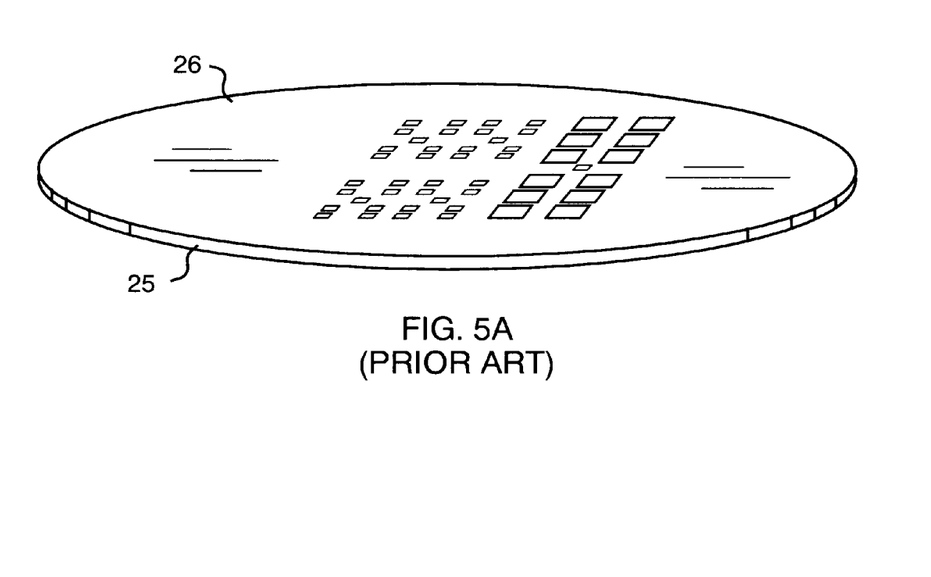

Then, as illustrated in FIG. 4B, the second reticle 24 is aligned onto the previously formed pattern. Then, the positive resist 26 is exposed to light, and thereafter, developed, as illustrated in FIG. 5A. Thus, the second pattern 23 for forming the second contact holes is transferred onto the positive resist 26.

Figure 5B:
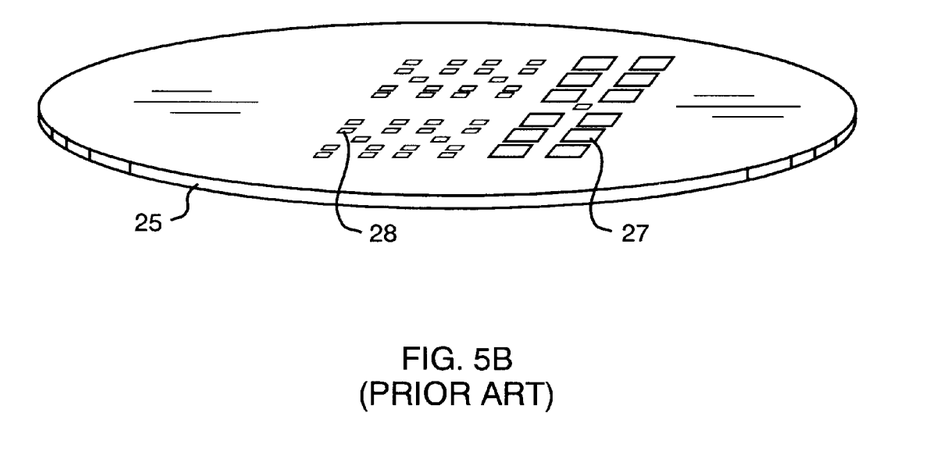

Then, the wafer 25 is etched with the thus patterned positive resist 26 being used as a mask. Then, the positive resist 26 is removed. Thus, the second contact holes 28 having a smaller size than a size of the first contact holes 27 are formed in the wafer 25, as illustrated in FIG. 5B.

In the above-mentioned method, it seems that there may be carried out steps of aligning the first reticle 22 onto a pattern formed in the previous step, exposing the positive resist 26 to light, aligning the second reticle 24 onto the previously formed pattern without developing the positive resist 26, and developing the positive resist 26. However, this method would take much time from the first exposure till development of the positive resist 26, which would generate variance in a dimension of the positive resist 26. In particular, when a chemically amplifying resist is to be used, if it would take much time from exposure till development, there would be generated significant variance in a dimension of the resist.

In addition, when two reticles are to be used for forming contact holes having different sizes as in the above-mentioned conventional method, the number of steps for forming contact holes is two times greater than the number of steps for forming a single contact hole.

A mask used for forming a contact hole is generally aligned onto a pattern of gate polysilicon. In such alignment, there is generated misalignment both between a greater-sized contact hole and gate polysilicon and between a smaller-sized contact hole and gate polysilicon. Hence, when the greater-sized and smaller-sized contact holes are to be arranged in series, they have to be spaced away from each other by a distance including a margin corresponding to doubled misalignment. As a result, a resultant chip is unavoidable to become greater in size.

For instance, Japanese Unexamined Patent Publication No. 3-270134 has suggested a method of fabricating a semiconductor device through the use of two masks. Specifically, the suggested method includes the steps of coating photoresist onto an interlayer insulating film formed on a semiconductor substrate, exposing the photoresist to light through a first mask having a pattern for forming a first contact hole, developing the photoresist, exposing the photoresist to light through a second mask having a pattern for forming a second contact hole smaller in a diameter than the first contact hole, developing and baking the photoresist, etching the interlayer insulating film to thereby form the first and second contact holes, and forming a wiring electrode.

Japanese Patent Publication No. 5-87179 has suggested a method of making a pattern so as to form contact holes having various sizes. In accordance with the method, a mask for forming a greater-sized contact hole is designed to have a hole smaller than a designed size, taking into consideration a difference in size to be generated when a pattern is formed.

SUMMARY OF THE INVENTION

In view of the above-mentioned problems, it is an object of the present invention to provide a reticle which is capable of transferring a contact hole to a resist just in a designed dimension regardless of a size thereof.

In one aspect of the present invention, there is provided a reticle used for fabrication of a semiconductor device, including (a) a first area in which a first mask having a first pattern is formed for forming a first contact hole having a first size, and (b) a second area in which a second mask having a second pattern is formed for forming a second contact hole having a second size different from the first size.

It is preferable that the first pattern has a greater density than a density of the second pattern. Herein, a density is defined as a ratio of a total area of the first or second pattern to an area of the first or second mask.

There is further provided a reticle used for fabrication of a semiconductor device, including (a) a first area in which a first mask is formed for forming a first linear pattern having a first size, and (b) a second area in which a second mask is formed for forming a second linear pattern having a second size different from the first size.

The first size may be equal to the second size, or different from said second size. In the latter case, it is preferable that the first linear pattern has a greater density than a density of the second linear pattern.

There is still further provided a reticle used for fabrication of a semiconductor device, including N areas in each of which a first to Nth mask having a first to Nth pattern, respectively, is formed for forming a first to Nth contact hole having a first to Nth size, respectively, wherein N is a positive integer equal to or greater than 3.

It is preferable that the first to Nth patterns have different densities from one another.

There is yet further provided a reticle used for fabrication of a semiconductor device, including N areas in each of which a first to Nth mask is formed for forming a first to Nth linear pattern having a first to Nth size, respectively, wherein N is a positive integer equal to or greater than 3.

The first to Nth size may be equal to one another, or different from one another. In the latter case, it is preferable that the first to Nth linear patterns have different densities from one another, the density being defined as a ratio of a total area of a linear pattern to an area of a mask.

In another aspect of the present invention, there is provided a method of fabricating a semiconductor device, including the steps of (a) preparing a reticle having a first area in which a first mask having a first pattern is formed for forming a first contact hole having a first size, and a second area in which a second mask having a second pattern is formed for forming a second contact hole having a second size different from the first size, (b) forming a resist film on a wafer, (c) aligning the first mask to the wafer, and exposing the resist film to light, (d) aligning the second mask to the wafer without developing the resist film, and exposing the resist film to light, and (e) developing the resist film.

It is preferable that the resist film is composed of chemically amplifying resist.

It is preferable that a scanning exposure apparatus is used in the steps (c) and (d) for exposing the resist film to light.

There is further provided a method of fabricating a semiconductor device, including the steps of (a) preparing a reticle having a first area in which a first mask is formed for forming a first linear pattern having a first size, and a second area in which a second mask is formed for forming a second linear pattern having a second size different from the first size, (b) forming a resist film on a wafer, (c) aligning the first mask to the wafer, and exposing the resist film to light, (d) aligning the second mask to the wafer without developing the resist film, and exposing the resist film to light, and (e) developing the resist film.

There is still further provided a method of fabricating a semiconductor device, including the steps of (a) preparing a reticle having N areas in each of which a first to Nth mask having a first to Nth pattern, respectively, is formed for forming a first to Nth contact hole having a first to Nth size, respectively, wherein N is a positive integer equal to or greater than 3, (b) forming a resist film on a wafer, (c) aligning the first mask to the wafer, and exposing the resist film to light, (d) aligning the second mask to the wafer without developing the resist film, and exposing the resist film to light, and (e) developing the resist film.

There is yet further provided a method of fabricating a semiconductor device, including the steps of (a) preparing a reticle having N areas in each of which a first to Nth mask is formed for forming a first to Nth linear pattern having a first to Nth size, respectively, wherein N is a positive integer equal to or greater than 3, (b) forming a resist film on a wafer, (c) aligning the first mask to the wafer, and exposing the resist film to light, (d) aligning the second mask to the wafer without developing the resist film, and exposing the resist film to light, and (e) developing the resist film.

The advantages obtained by the aforementioned present invention will be described hereinbelow.

The reticle in accordance with the present invention is designed to have a first area in which a first mask having a first pattern is formed for forming a first contact hole having a first size, and a second area in which a second mask having a second pattern is formed for forming a second contact hole having a second size different from the first size. Thus, it is possible to transfer a contact hole pattern onto a resist in exposure conditions suitable for a size of a contact hole to be transferred. Accordingly, a contact hole pattern can be transferred onto a resist just in a designed dimension regardless of a size of a contact hole.

In addition, application of a resist, development of an exposed resist, and etching a wafer are carried out only once, which ensures simplification in formation of a contact hole.

In accordance with the present invention, it is no longer necessary to exchange a reticle to a different one, and hence, misregistration between a pattern for forming a greater-sized contact hole and a pattern formed in the previous step is the same as misregistration between a pattern for forming a smaller-sized contact hole and a pattern formed in the previous step. Thus, a margin between a greater-sized contact hole and a smaller-sized contact hole could be minimized.

The use of a scanning exposure apparatus enables the use of a reticle extending in a scanning direction. Hence, the first and second masks may be arranged in a scanning direction.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 6:
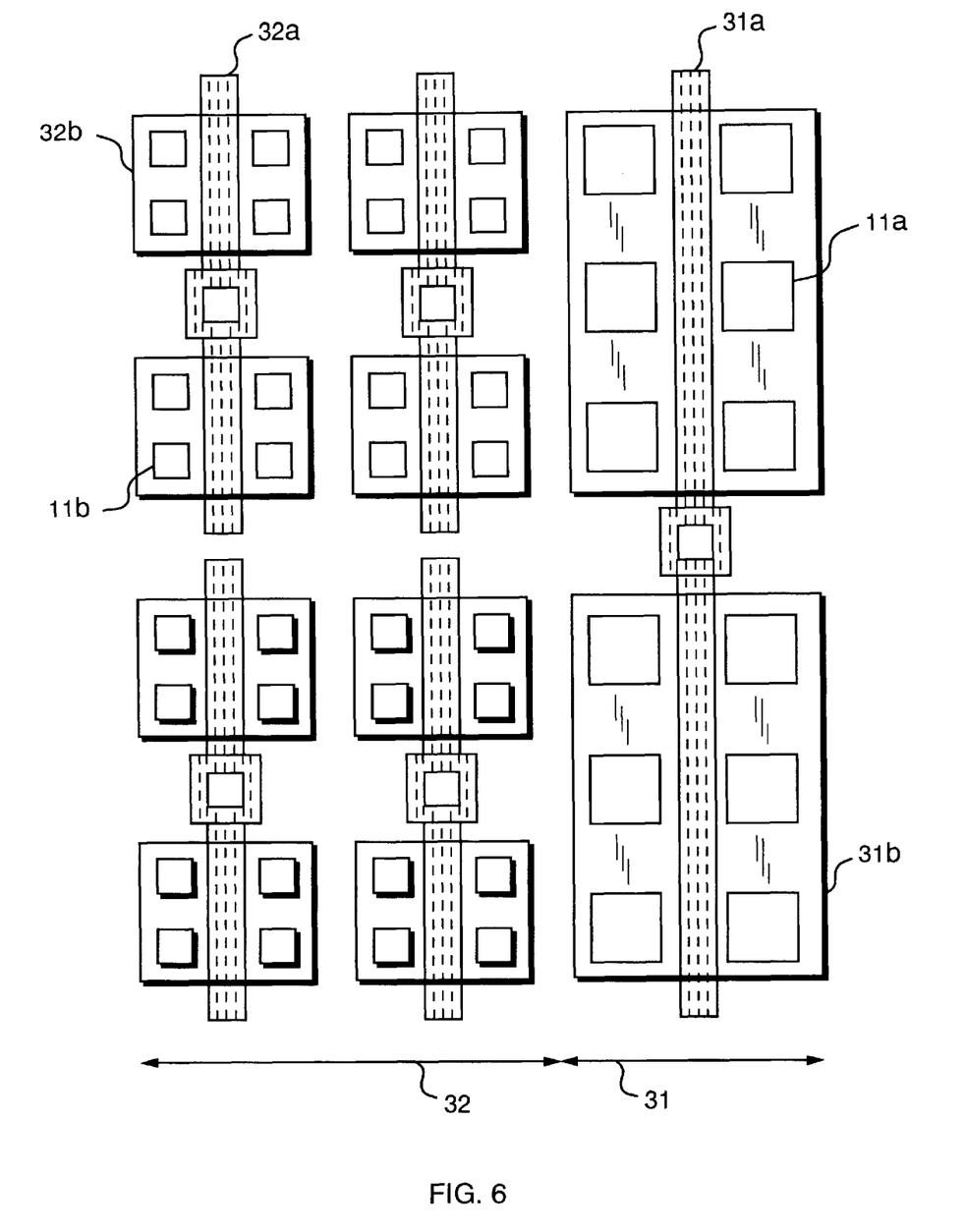
FIG. 6 is a plan view illustrating layout of a transistor.

FIG. 6 is a plan view of a first transistor 31 for inputting and outputting signals and a second transistor 32 for carrying out various operations. The first transistor 31 includes a gate electrode 31a and source/drain diffusion regions 31b, and the second transistor 32 includes a gate electrode 32a and source/drain diffusion regions 32b. Since much current flows through the first transistor 31, greater-sized contact holes 11a are formed in the source and drain regions 31b of the first transistor 31. On the other hand, smaller-sized contact holes 11b are formed in the source and drain regions 32b of the second transistor 32 for high integration.

Figure 7:
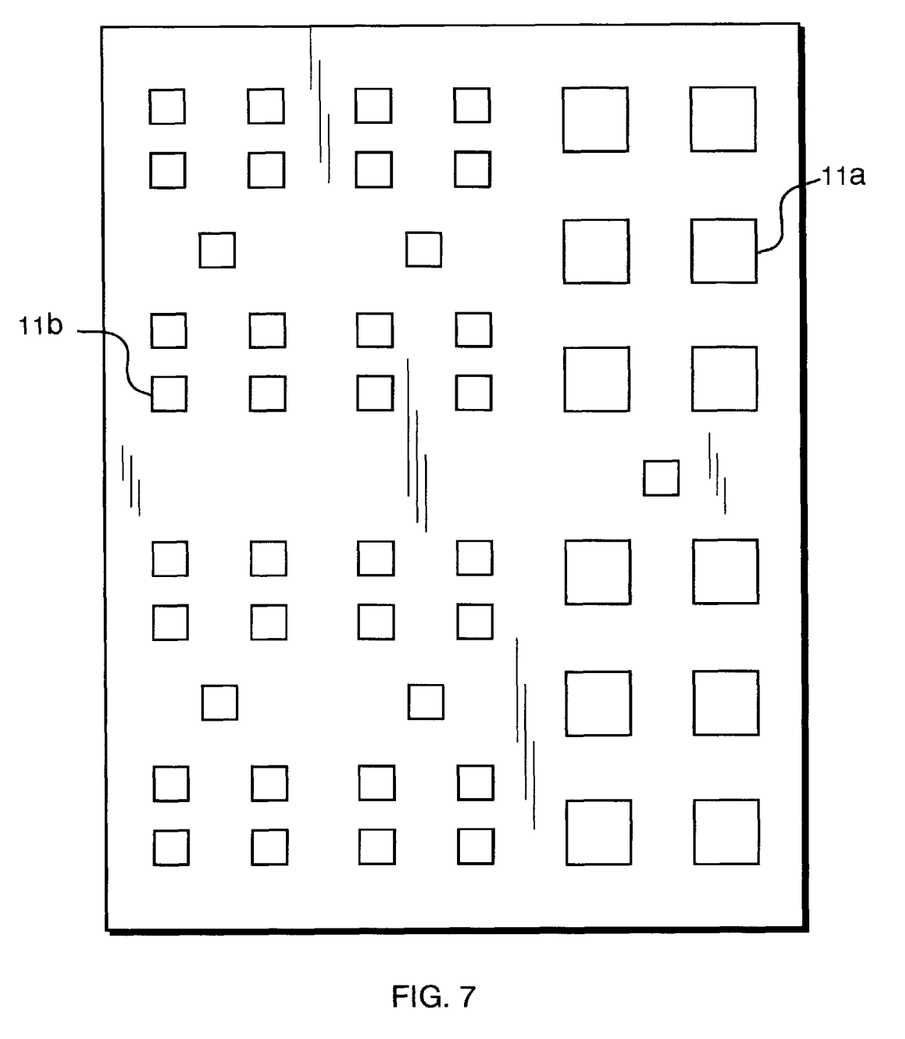
FIG. 7 is a plan view illustrating layout of contact holes in the transistor illustrated in FIG. 6.

FIG. 7 illustrates layout of the greater-sized contact holes 11a and the smaller-sized contact holes 11b.

Figure 8:
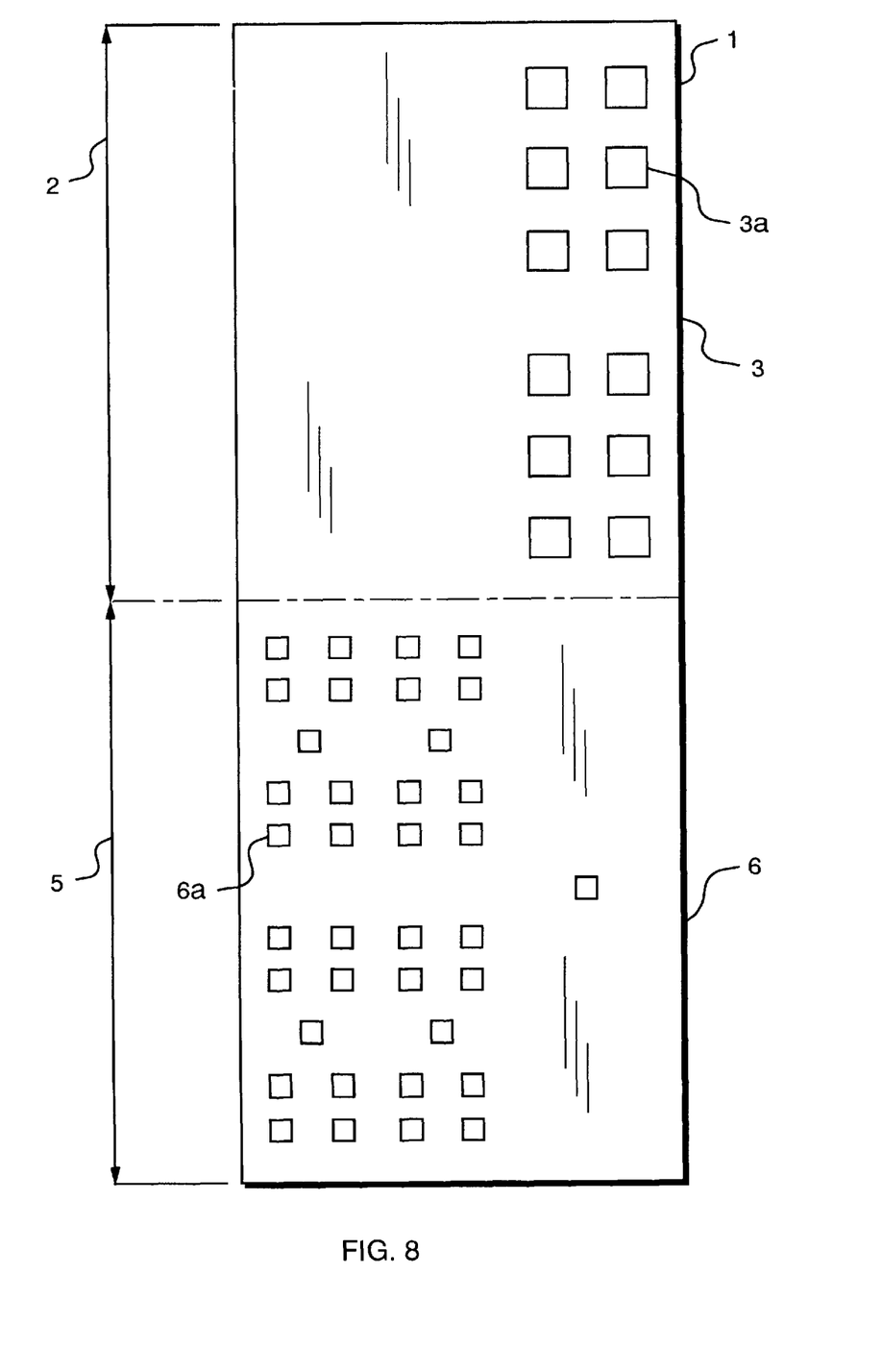
FIG. 8 is a plan view of a reticle in accordance with the first embodiment of the present invention.

FIG. 8 illustrates a reticle 1 used for fabricating the first and second transistors 31 and 32 illustrated in FIG. 6. The reticle 1 includes a first area 2 in which a first mask 3 having a first pattern 3a is formed for forming the greater-sized contact holes 11a, and a second area 5 in which a second mask 6 having a second pattern 6a is formed for forming the smaller-sized contact holes 11b.

A method of fabricating the first and second transistors 31 and 32 through the use of the reticle 1 is explained hereinbelow with reference to FIGS. 9A to 10C.

Figure 9A:
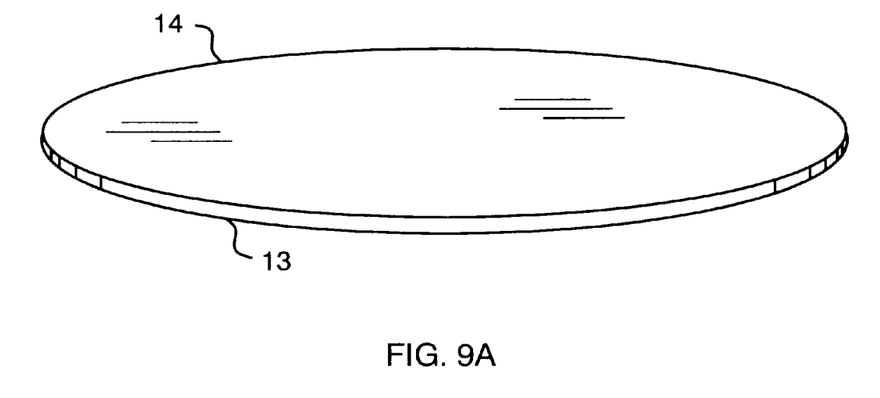
FIGS. 9A, 9B, 10A, 10B and 10C are perspective views of a wafer and a reticle, illustrating respective steps of a method of patterning a wafer through the use of the reticle illustrated in FIG. 8.

First, as illustrated in FIG. 9A, positive resist 14 is coated all over a wafer 13.

Figure 9B:
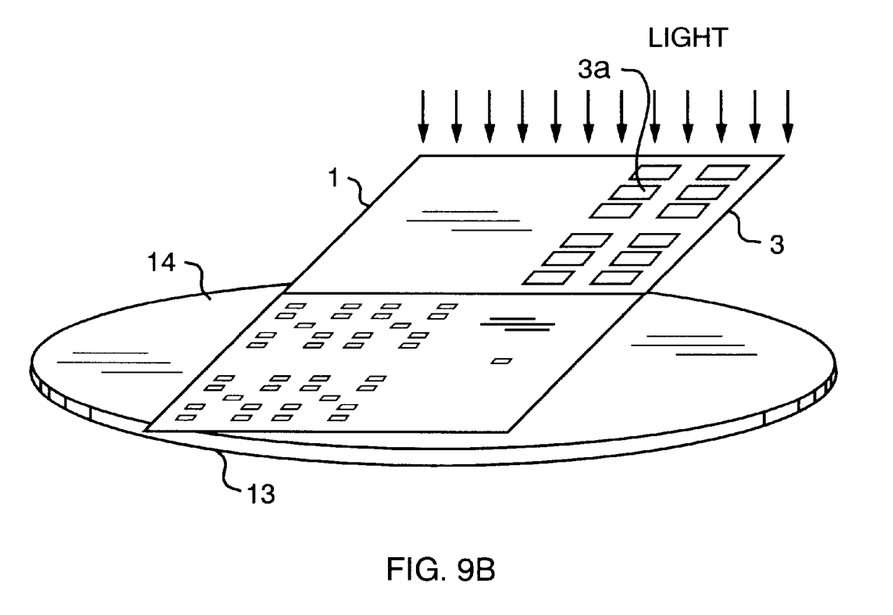

Then, as illustrated in FIG. 9B, the first mask 3 of the reticle 1 is aligned onto a pattern formed in the previous step, such as a mark of gate polysilicon. Then, the positive resist 14 is exposed to light in accordance with the first pattern 3a of the first mask 3.

Figure 10A:
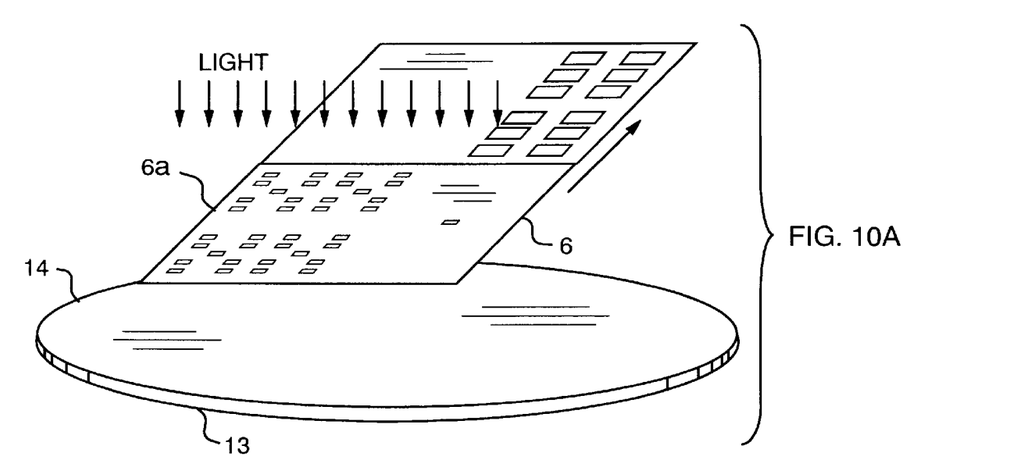

Then, as illustrated in FIG. 10A, the reticle 1 is horizontally moved. Then, the second mask 6 of the reticle 1 is aligned onto a pattern formed in the previous step. Then, the positive resist 14 is exposed to light in accordance with the second pattern 6a of the second mask 6.

Figure 10B:
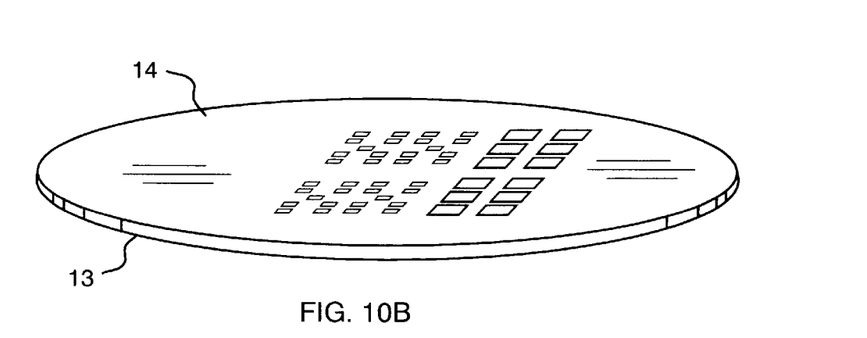

Thereafter, the positive resist 14 is developed, as illustrated in FIG. 10B. Thus, the first pattern 3a and the second pattern 6a are transferred onto the positive resist 14.

Then, the wafer 13 is etched with the thus patterned positive resist 14 being used as a mask. Then, the positive resist 14 is removed.

Figure 10C:
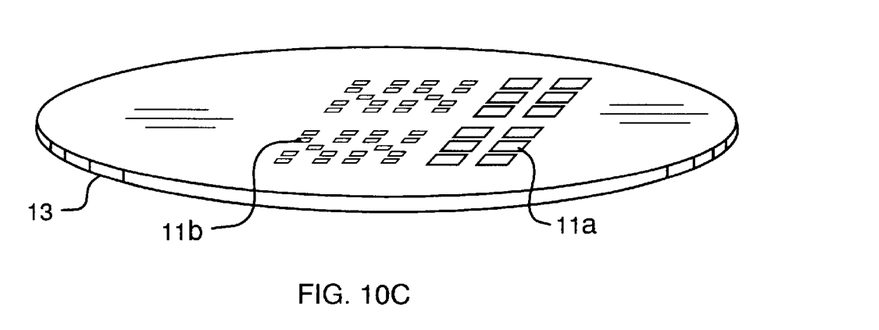

Thus, as illustrated in FIG. 10C, the greater-sized contact holes 11a and the smaller-sized contact holes 11b are formed in the wafer 13.

[Second Embodiment]

The reticle 1 in accordance with the first embodiment is an example wherein a condition for exposing a resist is dependent on a size of a contact hole. In formation of a linear pattern such as gate polysilicon, a condition for exposing a resist is dependent on a density of a pattern. Hence, if a pattern having a greater density and a pattern having a smaller density are exposed to light in the same exposure condition, a resist cannot be patterned as is designed. The second embodiment solves this problem.

Figure 11:
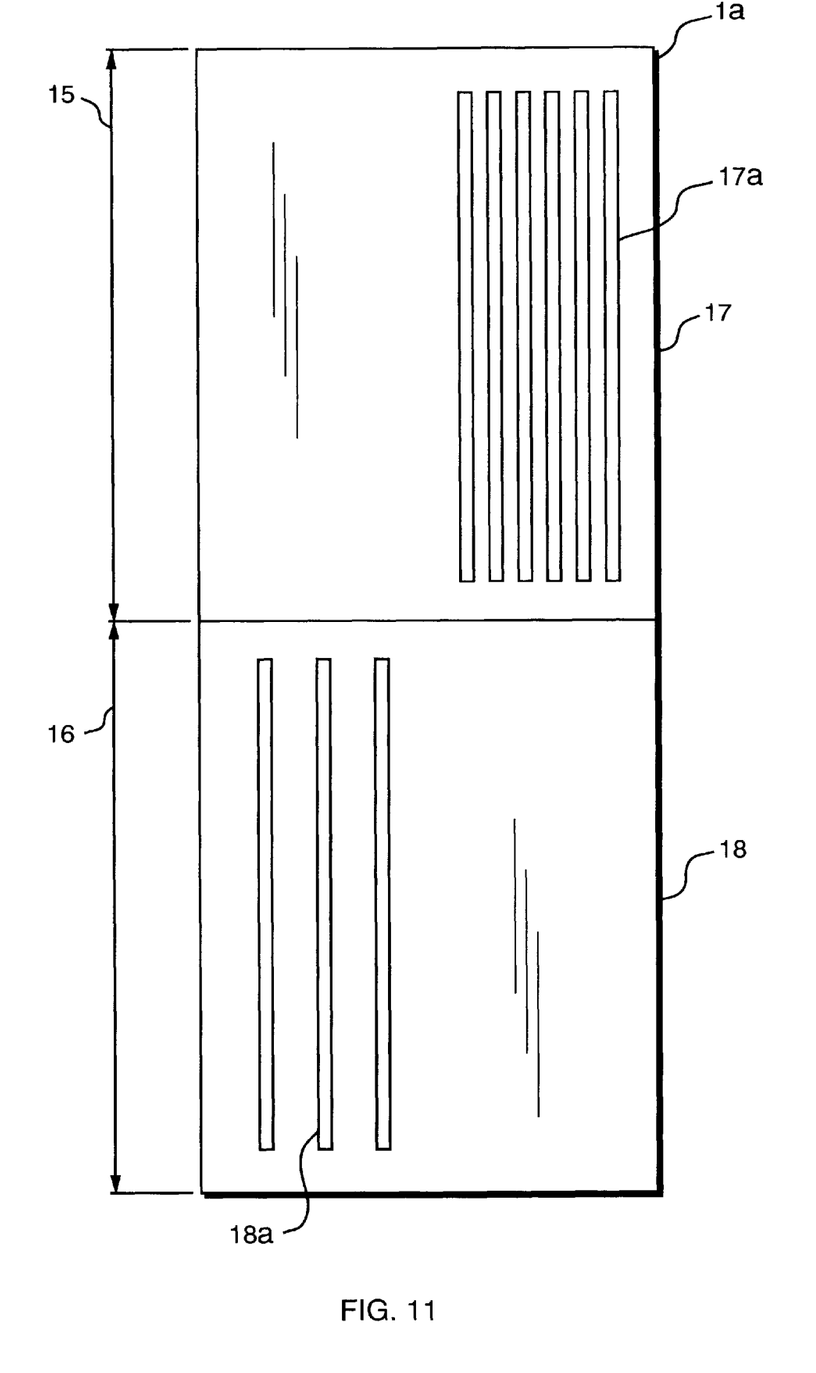
FIG. 11 is a plan view of a reticle in accordance with the second embodiment of the present invention.

FIG. 11 illustrates a reticle 1A in accordance with the second embodiment, used for forming gate polysilicon.

The illustrated reticle 1A includes a first area 15 in which a first mask 17 is formed for forming a first linear pattern 17a, and a second area 16 in which a second mask 18 is formed for forming a second linear pattern 18a.

As illustrated in FIG. 11, the first linear pattern 17a is comprised of six elongate slits, and the second linear pattern 18a is comprised of three elongate slits. The slits of the first linear pattern 17a have the same width and length as those of the slits of the second linear pattern 18a. However, the first linear pattern 17a has a greater density than a density of the second linear pattern 18a. Herein, a density is defined as a ratio of a total area of the first and second linear pattern 17a and 18a to an area of the first and second mask 17 and 18, respectively.

A method of patterning a wafer through the use of the reticle 1A is explained hereinbelow.

First, negative resist is coated all over a wafer.

Then, the first mask 17 of the reticle 1A is aligned onto a pattern formed in the previous step. Then, the negative resist is exposed to light in accordance with the first linear pattern 17a of the first mask 17.

Then, the reticle 1A is horizontally moved. Then, the second mask 18 of the reticle 1A is aligned onto a pattern formed in the previous step. Then, the negative resist is exposed to light in accordance with the second linear pattern 18a of the second mask 18.

Thereafter, the negative resist is developed. Thus, the first linear pattern 17a and the second linear pattern 18a are transferred onto the negative resist.

Then, the wafer is etched with the thus patterned negative resist being used as a mask. Then, the negative resist is removed.

Thus, the slits defined by the first and second linear patterns 17a and 18a are formed in the wafer.

The reticle 1A in accordance with the second embodiment is designed to include the first linear pattern 17a and the second linear pattern 18a having a smaller density than a density of the first linear pattern 17a. The reticle 1A makes it possible to transfer the first and second patterns 17a and 18a onto a resist in exposure conditions suitable for the first and second patterns 17a and 18a. Hence, it is possible to transfer a pattern onto a resist in a designed dimension regardless of a density of a pattern.

[Third Embodiment]

The reticle 1 in accordance with the first embodiment is designed to have the first and second masks 3 and 6, and the reticle 1A in accordance with the second embodiment is designed to have the first and second masks 17 and 18. Namely, the reticles 1 and 1A are designed to have two masks.

However, it should be noted that the reticle in accordance with the invention may be designed to have N areas wherein N is a positive integer equal to or greater than 3. A first to Nth mask having a first to Nth pattern is formed in first to Nth areas, respectively, for forming a first to Nth contact hole having a first to Nth size, respectively.

As an alternative, a first to Nth mask having a first to Nth linear pattern is formed in first to Nth areas, respectively, for forming a first to Nth slit having the same size or different sizes.

The reticle having N masks provides the same advantages as those obtained by the above-mentioned first and second embodiments.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-323657 filed on Nov. 13, 1998 including specification, claims, drawings and summary is incorporated herein by reference in its entirety.

What is claimed is:

1. A method of fabricating a semiconductor device, comprising the steps of:
    (a) preparing a reticle having a first area in which a first light blocking portion is formed and in which a first mask portion having a first pattern is formed for forming a first contact hole having a first size, and a second area in which a second light blocking portion is formed and in which a second mask portion having a second pattern is formed for forming a second contact hole having a second size different from said first size;
    (b) forming a resist film on a wafer;
    (c) aligning said first mask portion of said first area of said reticle to a first selected portion of said wafer and aligning said first light blocking portion to a second selected portion of said wafer, and exposing said resist film to light passing through said first mask;
    (d) aligning said second mask portion of said second area of said reticle to the second selected portion of said wafer and aligning said second light blocking portion to said first selected portion of said wafer without developing said resist film, and exposing said resist film to light passing through said second mask; and
    (e) developing said resist film.

2. The method as set forth in claim 1, wherein said resist film is composed of chemically amplifying resist.

3. The method as set forth in claim 1, wherein a scanning exposure apparatus is used in said steps (c) and (d) for exposing said resist film to light passing through said respective mask portions.

4. A method of fabricating a semiconductor device, comprising the steps of:
    (a) preparing a reticle having a first area in which a first light blocking portion is formed and in which a first mask portion is formed for forming a first linear pattern having a first size, and a second area in which a second light blocking portion is formed and in which a second mask portion is formed for forming a second linear pattern having a second size different from said first size;
    (b) forming a resist film on a wafer;
    (c) aligning said first mask portion of said first area of said reticle to a first selected portion of said wafer and aligning said first light blocking portion to a second selected portion of said wafer, and exposing said resist film to light passing through said first mask;
    (d) aligning said second mask portion of said second area of said reticle to the second selected portion of said wafer and aligning said second light blocking portion to said first selected portion of said wafer without developing said resist film, and exposing said resist film to light passing through said second mask; and
    (e) developing said resist film.

5. The method as set forth in claim 4, wherein said resist film is composed of chemically amplifying resist.

6. The method as set forth in claim 4, wherein a scanning exposure apparatus is used in said steps (c) and (d) for exposing said resist film to light passing through said respective mask portions.

7. A method of fabricating a semiconductor device, comprising the steps of:
    (a) preparing a reticle having N areas in each of which a first to Nth mask having a first to Nth pattern and a first to Nth light blocking area, respectively, is formed for forming a first to Nth contact hole having a first to Nth size, respectively, wherein N is a positive integer equal to or greater than 3;
    (b) forming a resist film on first through Nth portions of a wafer, said first through Nth portions of said wafer corresponding to said N areas on said reticle;
    (c) aligning said first mask to said first portion of said wafer and aligning said first light blocking portion to said second through N portions, respectively, of said wafer, and exposing said resist film to light;
    (d) aligning a next successive mask to next successive portions of said wafer and aligning a next successive light blocking portion to corresponding portions of said wafer without developing said resist film, and exposing said resist film to light;
    (e) repeating said step (d) until said Nth mask is aligned and a corresponding portion of said resist film is exposed; and
    (f) developing said resist film.

8. The method as set forth in claim 7, wherein said resist film is composed of chemically amplifying resist.

9. The method as set forth in claim 7, wherein a scanning exposure apparatus is used in said steps (c) and (d) for exposing said resist film to light passing through said respective mask portions.

10. A method of fabricating a semiconductor device, comprising the steps of:
    (a) preparing a reticle having N areas in each of which a first to Nth mask and a first to Nth light blocking area is formed for forming a first to Nth linear pattern having a first to Nth size, respectively, wherein N is a positive integer equal to or greater than 3;
    (b) forming a resist film on first through Nth portions of a wafer, said first through Nth portions of said wafer corresponding to said N areas on said reticle;
    (c) aligning said first mask to said first portion of said wafer and aligning said first light blocking portion to said second through N portions, respectively, of said wafer, and exposing said resist film to light;
    (d) aligning a next successive mask to next successive portions of said wafer and aligning a next successive light blocking portion to corresponding portions of said wafer without developing said resist film and exposing said resist film to light;
    (e) repeating said step (d) until said Nth mask is aligned and a corresponding portion of said resist film is exposed; and
    (f) developing said resist film.

11. The method as set forth in claim 10, wherein said resist film is composed of chemically amplifying resist.

12. The method as set forth in claim 10, wherein a scanning exposure apparatus is used in said steps (c) and (d) for exposing said resist film to light passing through said respective mask portions.

* * * * *